US008953331B2

(12) United States Patent
Sugimoto et al.

(10) Patent No.: US 8,953,331 B2
(45) Date of Patent: Feb. 10, 2015

(54) CARD KEY

(75) Inventors: Keiichi Sugimoto, Kariya (JP); Mitsuru Nakagawa, Chiryu (JP)

(73) Assignee: Denso Corporation, Kariya (JP)

( * ) Notice: Subject to any disclaimer, the term of this patent is extended or adjusted under 35 U.S.C. 154(b) by 434 days.

(21) Appl. No.: 13/563,770

(22) Filed: Aug. 1, 2012

(65) Prior Publication Data

US 2013/0039024 A1 Feb. 14, 2013

(30) Foreign Application Priority Data

Aug. 10, 2011 (JP) ................. 2011-174913

(51) Int. Cl.
H05K 5/00 (2006.01)
H05K 7/00 (2006.01)
E04G 1/10 (2006.01)
A47B 96/06 (2006.01)
E05C 5/02 (2006.01)
E05B 19/00 (2006.01)
G07C 9/00 (2006.01)

(52) U.S. Cl.
CPC ........ E05B 19/0082 (2013.01); G07C 9/00944 (2013.01); G07C 2009/00952 (2013.01)
USPC ........... 361/757; 361/752; 361/753; 361/754; 361/758; 361/759; 361/762; 361/763; 361/764; 361/679.03; 361/679.24; 292/341.17; 292/8; 292/4

(58) Field of Classification Search
USPC ............... 361/679.01–679.09, 679.1–679.19, 361/679.21–679.29, 361/679.31–679.45, 361/679.55–679.6, 724–764; 248/917–924, 248/80–88, 155.1–155.5, 166–173, 248/180.1–186.2, 229.1–231.51, 271.4, 248/292.14, 316.1–316.8; 292/1–62, 113, 292/169.11–169.23, 341.11–341.19; 439/60, 151–160, 327, 328, 331, 638
See application file for complete search history.

(56) References Cited

U.S. PATENT DOCUMENTS

| 6,462,291 | B1 * | 10/2002 | Sachs ........................ 200/302.2 |
| 7,577,406 | B2 | 8/2009 | Nakagawa et al. |
| 8,072,766 | B2 | 12/2011 | Shimura et al. |
| 2005/0136852 | A1 * | 6/2005 | Nakagawa et al. .......... 455/90.3 |
| 2006/0252384 | A1 | 11/2006 | Sugimoto et al. |
| 2009/0086445 | A1 | 4/2009 | Sugimoto et al. |

(Continued)

FOREIGN PATENT DOCUMENTS

| CN | 1629440 | 6/2005 |
| JP | 2004-068417 | 3/2004 |

(Continued)

OTHER PUBLICATIONS

Office action dated May 23, 2013 in corresponding Japanese Application No. 2011-174913.

(Continued)

Primary Examiner — Jerry Wu
(74) Attorney, Agent, or Firm — Harness, Dickey & Pierce, PLC (57) ABSTRACT

A card key has a molded body and an upper and a lower housings. The molded body has a circuit board, to which electronic parts for communicating with an in-vehicle equipment are mounted and which is covered with resin. The molded body is formed in a plate shape. The upper and the lower housings are fixed to each other so that the molded body is arranged between them. An external appearance of the card key is defined by the upper and the lower housings.

4 Claims, 5 Drawing Sheets

(56) References Cited

U.S. PATENT DOCUMENTS

| | | | |
|---|---|---|---|
| 2009/0086446 A1 | 4/2009 | Sugimoto et al. | |
| 2009/0086447 A1 | 4/2009 | Sugimoto et al. | |
| 2009/0145187 A1* | 6/2009 | Deppner et al. | 70/448 |

FOREIGN PATENT DOCUMENTS

| | | |
|---|---|---|
| JP | 2004-134835 | 4/2004 |
| JP | 2004-241476 | 8/2004 |
| JP | 2005-179942 | 7/2005 |
| JP | 2007-224664 | 9/2007 |
| JP | 2007-227246 | 9/2007 |
| JP | 2009-044351 | 2/2009 |

OTHER PUBLICATIONS

Office action dated Oct. 25, 2013 in corresponding Korean Application No. 10-2012-87131.

Office action dated Jun. 27, 2014 in corresponding Chinese Application No. 201210280793.8.

* cited by examiner

CARD KEY

CROSS REFERENCE TO RELATED APPLICATION

This application is based on Japanese Patent Application No. 2011-174913 filed on Aug. 10, 2011, the disclosure of which is incorporated herein by reference.

TECHNICAL FIELD

The present invention relates to a card key, in particular, a card key functioning as an electronic key (a mobile device) for a vehicle.

BACKGROUND

An electronic key (a mobile device) is known in the art, for example, as disclosed in the following prior-art publications:
 (1) Japanese Patent Publication No. 2007-224664(A);
 (2) Japanese Patent Publication No. 2007-227246(A);
 (3) Japanese Patent Publication No. 2004-134835(A);
 (4) Japanese Patent Publication No. 2004-241476(A); and
 (5) Japanese Patent Publication No. 2006-303327(A).

According to the known electronic key, the electronic key transmits a unique ID code of a vehicle to an in-vehicle equipment in answer to an inquiry signal from the in-vehicle equipment, so that a lockup or an unlock of a vehicle door lock is automatically authorized and/or an operation for starting up an engine is authorized when the ID code is verified. In the electronic key, for example, as disclosed in the above prior-art publications (1) to (4), a circuit board and a battery are generally accommodated in a casing, which is sealed up by a cover member. According to a structure of the electronic key of this kind, the electronic key is likely to go thick and therefore it is not easy to carry around such an electronic key. According to the above prior-art publication (5), the electronic key is formed in a card shape (hereinafter, such a key is called as a card key).

Figure 7:
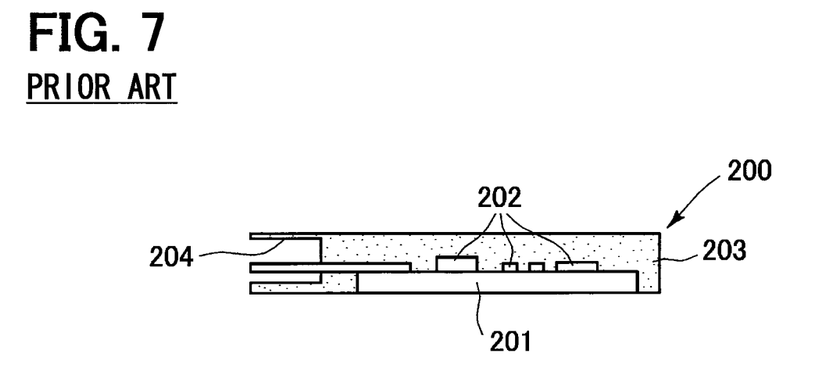
FIG. 7 is a schematic cross sectional view showing a prior-art card key.
Figure 8:
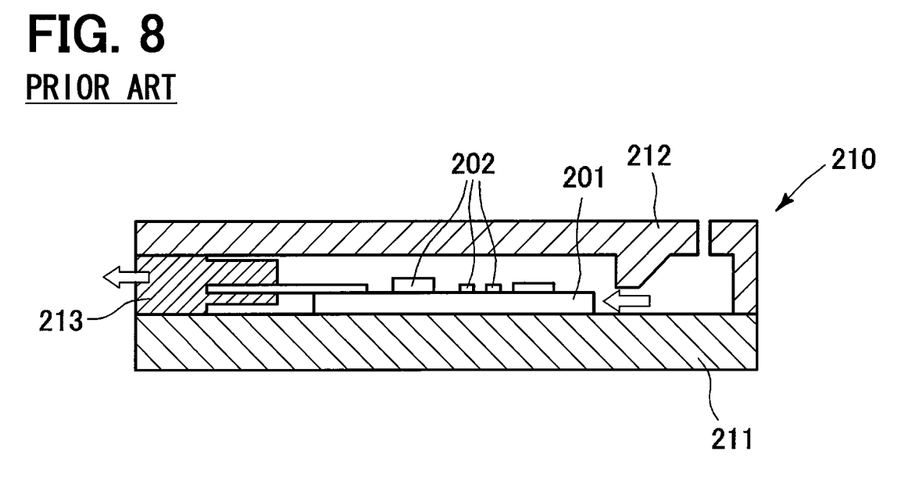
FIG. 8 is a schematic cross sectional view showing a molding die for manufacturing the card key shown in FIG. 7.

As shown in FIGS. 7 and 8, in the card key 200 of the above prior-art publication, electronic parts 202 for carrying out wireless communication with an in-vehicle equipment are mounted to a circuit board 201, wherein the electronic parts 202 and the circuit board 201 are covered by resin material 203 and molded in a plate shape. The card key 200 is manufactured by an injection molding process, according to which the resin is injected into a molding die 210, which is composed of a lower die (a core plate) 211, an upper die (a cavity plate) 212 and a slide core (a bushing) 213, as shown in FIG. 8. More in detail, the circuit board 201 is arranged on the lower die 211. Namely, a flat rear-side surface of the circuit board 201 is brought into contact with the lower die 211, while a predetermined three dimensional space is formed by the upper die 212 on a side opposite to the rear-side surface (that is, an upper side). When the slide core 213 is removed from the molding die 210, a hole extending in a lateral direction (such as, for example, a battery accommodating space) is formed.

According to the above prior-art card key 200, the three dimensional shape is formed only on the upper side thereof. Then, a surface finishing process (such as a coating, printing, or the like) is carried out for an upper-side surface. For the rear-side surface of the card key 200, a surface finishing process (the coating, the printing or the like) is carried out after a polishing process. It is a trend that a design for the card key is standardized on one hand. On the other hand, there is a strong demand in the market for facilitating the spread of the card key.

SUMMARY OF THE DISCLOSURE

The present disclosure is made in view of the above points. It is an object of the present disclosure to provide a card key, which is low in cost and a design (an external appearance) of which is improved.

According to a feature of the present disclosure, a card key has a molded body having a circuit board, to which electronic parts for communicating with an in-vehicle equipment are mounted and which is covered with and integrally molded with resin. The molded body is formed in a plate shape. The card key has an upper housing and a lower housing fixed to each other so as to accommodate the molded body in a space formed between the upper and the lower housings. An external appearance of the card key is defined by the upper and the lower housings. For example, each of the upper and the lower housings has a three-dimensional outer surface.

According to the above feature, the molded body is accommodated in the card key, wherein the upper and the lower housings opposing to each other are fixed to each other, so that the external appearance of the card key is defined by the upper and the lower housings.

In the conventional card key, the surface finishing process is limited to the front-side surface by constrains in view of the manufacturing process. However, according to the present disclosure, the surface finishing process can be done for almost all portions of the upper and the lower housings of the card key. In particular, when three-dimensional surfaces are formed not only in the upper housing but in the lower housing, great individuality (such as, good feeling, aesthetic appearance or the like), which can not be realized by the conventional card key, can be realized in the present disclosure.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION OF THE EMBODIMENTS

The present disclosure will be explained by way of embodiments with reference to the drawings.

(First Embodiment)

Figure 1A:
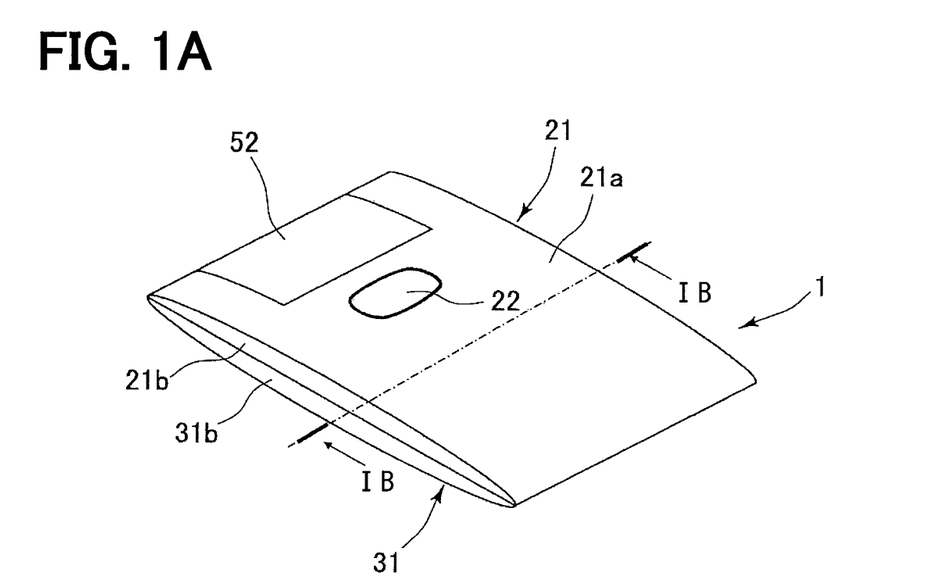
FIG. 1A is a schematic perspective view showing a card key according to an embodiment of the present disclosure.
Figure 1B:
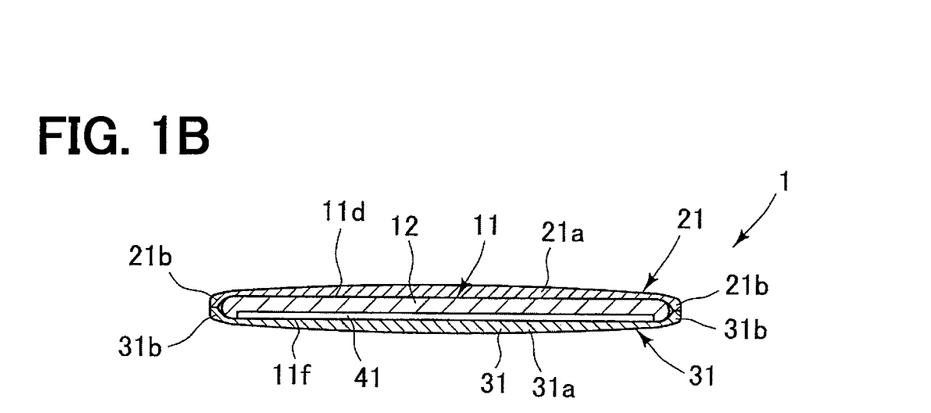
FIG. 1B is a schematic cross sectional view taken along a line IB-IB in FIG. 1A.
Figure 2:
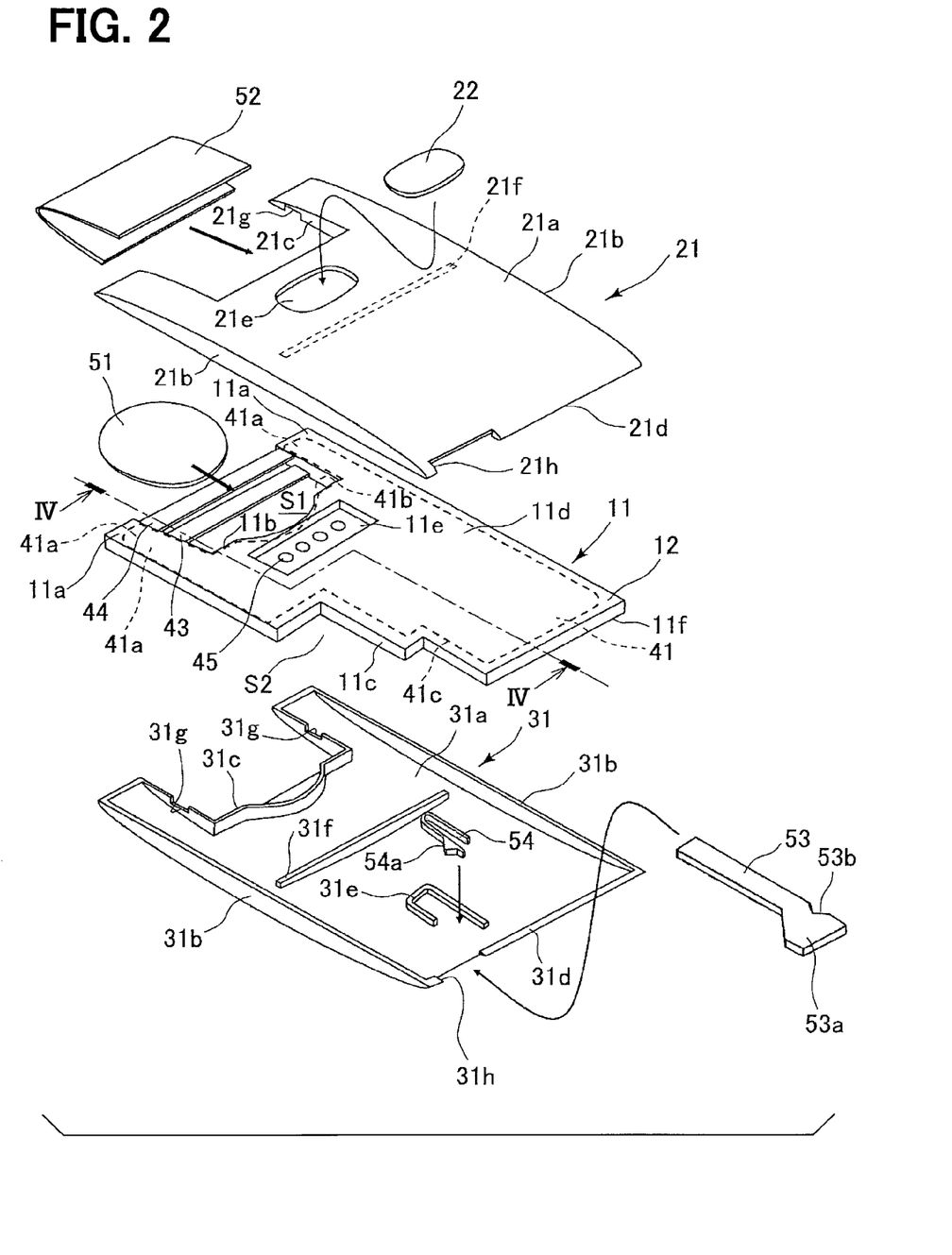
FIG. 2 is a schematic exploded perspective view of the card key shown in FIG. 1A.
Figure 3:
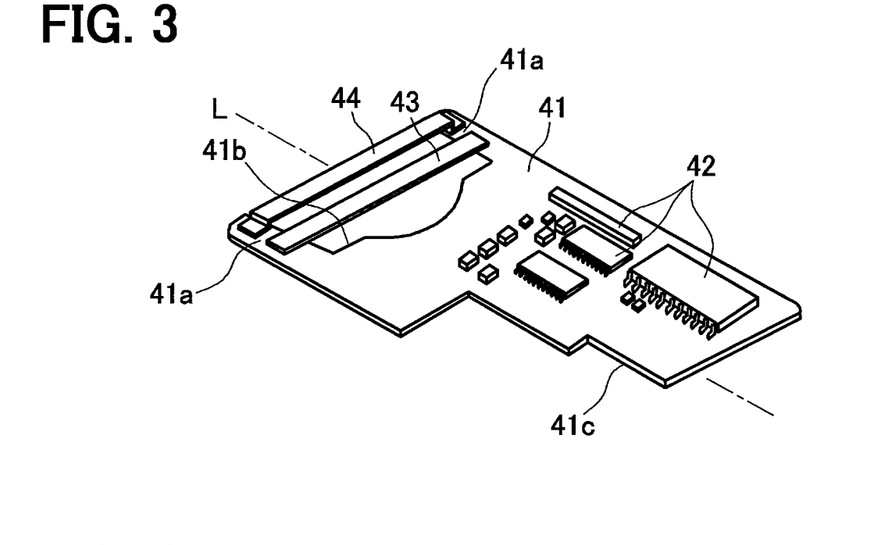
FIG. 3 is a schematic perspective view showing a circuit board shown in FIG. 2.

FIGS. 1A, 1B and 2 show a card key 1 according to an embodiment of the present disclosure. The card key 1 is composed of a molded body 11, wherein a circuit board 41 is covered with and integrally molded with resin material. Various kinds of electronic parts 42 for carrying out wireless communication with an in-vehicle equipment (not shown) are mounted to the circuit board 41 (as shown in FIG. 3). The card key 1 is further composed of an upper housing 21 and a lower housing 31, which are fixed to each other and accommodate the molded body 11 in an inside thereof.

The card key 1 further has a battery 51 of a button type for supplying electric power to the circuit board 41, a battery cover 52 for preventing the battery 51 from dropping out of the card key 1, a mechanical key 53 for manually operating in case of emergency, a hook 54 (FIG. 2) for holding the mechanical key 53, and so on. The card key 1 carries out various kinds of functions for a vehicle, for example, an automatic operation for locking or un-locking a vehicle door, an operation for starting an engine, a manual operation for locking or un-locking the vehicle door when a battery power of the battery 51 is reduced, and so on.

As shown in FIG. 3, the circuit board 41 is formed in an almost rectangular shape, wherein an intermediate portion of a short side is cut out to form a cut-out portion 41b. A pair of leg portions 41a is thereby formed across the cut-out portion 41b, wherein each of the leg portions 41a extends in parallel to a center line L, which extends in a longitudinal direction of the circuit board 41. A front surface of the circuit board 41 (an upper-side surface in FIG. 3) corresponds to a surface, to which the electronic parts 42 are mounted, while a rear surface of the circuit board 41 (a lower-side surface in FIG. 3) corresponds to a surface, to which no electronic parts are mounted.

A pair of battery terminals 43 and 44, each of which extends in parallel to each other in a direction perpendicular to the center line L, is provided on the circuit board 41 so as to bridge the leg portions 41a. Each end of the battery terminals 43 and 44 is electrically connected, for example, by soldering, to wiring patterns formed on the circuit board 41. The battery terminal 44 is a positive-side terminal to be connected to a positive side of the battery 51, while the battery terminal 43 is a negative-side terminal to be connected to a negative side of the battery 51. Each intermediate portion of the battery terminals 43 and 44 is arranged at a different level from each other, so that a distance between them in a thickness direction of the circuit board 41 is slightly smaller than a thickness of the battery 51.

Another cut-out portion 41c is formed in the circuit board 41 at a longitudinal side thereof opposite to the cut-out portion 41b (the leg portions 41a). A portion of a corner of the circuit board 41 is cut out to form the cut-out portion 41c having a stepped portion.

As shown in FIG. 2, the molded body 11 (that is, a card-key module) is an insert-molding body, in which the circuit board 41 is molded with resin 12, for example, thermosetting epoxy resin (EP), by an insert-molding process. The molded body 11 has a pair of forked portions 11a covering the respective leg portions 41a of the circuit board 41, wherein the battery terminals 43 and 44 are exposed to an outside of the molded body 11. The molded body 11 further has notched portions 11b and 11c respectively corresponding to the cut-out portions 41b and 41c of the circuit board 41.

The forked portions 11a of the molded body 11 are opposing to each other, a distance of which in a width direction is slightly larger than an outer diameter of the battery 51. A space of the notched portion 11b formed between the forked portions 11a functions as a battery accommodating space S1 for accommodating the battery 51 in the card key 1. A space formed by the notched portion 11c functions as a key accommodating space S2 for accommodating the mechanical key 53 in the card key 1.

A recessed portion 1ie is formed in a first main surface 11d of the molded body 11 (an upper-side surface in FIG. 2). Multiple test points 45 are molded in the molded body 11 and each one end thereof is exposed to the outside in the recessed portion 1ie. The test points 45 have a function as information input terminals for registering predetermined information and/or changing registered information. Each other end of the test points 45 is connected (for example, soldered) to the wiring patterns formed on the circuit board 41. Since the test points 45 are set in the recessed portion 1ie, it is prevented that the exposed ends of the test points 45 may be brought into contact with an inside surface (a rear surface) of the upper housing 21. In other words, wrong input of the information to the circuit board 41 can be avoided.

Figure 4:
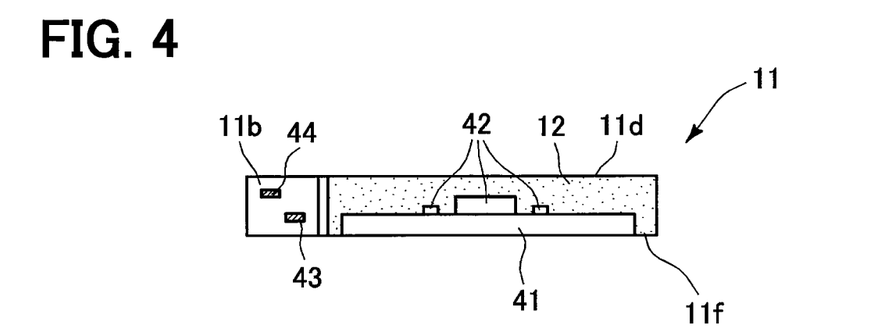
FIG. 4 is a schematic cross sectional view taken along a line IV-IV in FIG. 2.

As shown in FIG. 4, the rear surface (the lower-side surface) of the circuit board 41 is exposed to the outside of the molded body 11 at a second main surface 11f thereof (a lower-side surface in FIG. 2). In other words, the rear surface of the circuit board 41 forms a part of the second main surface 11f of the molded body 11.

The upper housing 21 and the lower housing 31 are made of thermosetting resin, such as, polycarbonate (PC), polyethylene terephthalate (PET), methacrylate resin (PMMA) or the like. A surface finishing process is carried out for each of the upper and lower housings 21 and 31 in order to identifying an external appearance of the card key 1. The surface finishing process is made by a painting, a printing or the like, so as to apply an identifying shape, design and hue and/or a combination thereof to the housings 21 and 31.

As shown in FIG. 1A or FIG. 2, the upper housing 21 is formed in a rectangular shape in a planar view. The upper housing 21 has a main wall 21a opposing to the first main surface 11d of the molded body 11. The main wall 21a has a curved surface, which is outwardly expanded so as to be formed in a stereoscopically-presented manner. In addition, the main wall 21a is integrally formed with a pair of side walls 21b at long-side peripheries and another pair of side walls 21c and 21d on short-side peripheries.

A recessed portion 21e is formed on an outer surface of the main wall 21a. A marking member 22 (a corporate mark and/or a car model name is displayed) is attached to the recessed portion 21e. A rib 21f is formed on the inside surface of the main wall 21a in a direction perpendicular to a longitudinal direction of the main wall 21a, wherein the rib 21f is brought into contact with the first main surface 11d of the molded body 11 so as to assure stability of the molded body 11 in the upper housing 21.

Each of the side walls 21b and 21d straightly extends along an outer periphery of the main wall 21a. The side wall 21c is formed in a U-letter shape along an outer periphery of the notched portion 11b of the molded body 11. A pair of grooves 21g is formed in the side wall 21c in order to avoid an interference with ends of the battery terminal 44. A portion of the side wall 21d is cut out to form an opening portion 21h, through which the mechanical key 53 is inserted into or taken out from the card key 1.

In a similar manner to the upper housing 21, the lower housing 31 is formed in a rectangular shape in a planar view. The lower housing 31 has a main, wall 31a opposing to the second main surface 11f of the molded body 11. The main wall 31a has a curved surface, which is outwardly expanded so as to be formed in a stereoscopically-presented manner. In addition, the main wall 31a is integrally formed with a pair of side walls 31b at long-side peripheries and another pair of side walls 31c and 31d on short-side peripheries. Each of the side walls 31b, 31c and 31d is symmetrically arranged to the side walls 21b, 21c and 21d of the upper housing 21. The side walls 31b to 31d of the lower housing 31 are firmly fixed to the corresponding side walls 21b to 21d of the upper housing 21.

A hook holding portion 31e is formed on an inside surface of the main wall 31a, so that the mechanical key 53 can be held in the card key 1. A rib 31f is formed on the inside surface of the main wall 31a in a direction perpendicular to the longitudinal direction of the main wall 31a, wherein the rib 31f is brought into contact with the second main surface 11f of the molded body 11 so as to assure stability of the molded body 11 in the lower housing 31.

Each of the side walls 31b and 31d straightly extends along an outer periphery of the main wall 31a. The side wall 31c is formed in a U-letter shape along the outer periphery of the notched portion 11b of the molded body 11. A pair of grooves 31g is formed in the side wall 31c in order to avoid an interference with ends of the battery terminal 43. A portion of the side wall 31d is cut out to form an opening portion 31h, through which the mechanical key 53 is inserted into or taken out from the card key 1.

As schematically shown in FIG. 2 (a key groove is not shown), the mechanical key 53 is made of a metal plate and formed in an almost L-letter shape, for example, by punching press work. The mechanical key 53 is accommodated in the key accommodating space S2 of the card key 1. The mechanical key 53 can be inserted into or taken out from the card key 1 through an opening formed by the respective opening portions 21h and 31h of the upper and lower housings 21 and 31.

A notched portion 53b is formed in a side surface of a grip portion 53a of the mechanical key 53. When a projection 54a of the hook 54 is engaged with the notched portion 53b, the mechanical key 53 is firmly held in the card key 1 by the hook 54, so that the mechanical key 53 is prevented from dropping out from the key accommodating space S2 of the card key 1.

The hook 54 is made of resin (for example, polyphenylene sulfide (PPS), polyamide (PA), or the like) and formed in a U-letter shape. The hook 54 is arranged in the hook holding portion 31e. When the mechanical key 53 is inserted into the card key 1 and the projection 54a of the hook 54 is engaged with the notched portion 53b of the mechanical key 53, a distance between the projection 54a and an opposite end of the U-letter shaped hook 54 is increased (in other words, a spring reaction force is decreased). When the projection 54a of the hook 54 becomes out of engagement from the notched portion 53b, the U-letter shaped hook 54 is compressed and the distance between the projection 54a and the opposite end of the hook 54 is decreased (in other words, the spring reaction force is increased). The spring force can be adjusted when a thickness and/or a height of the hook 54 is changed or when glass is added to resin material for the hook 54. The structure of the hook 54 and the projection 54a may be so modified that the projection 54a is biased by a spring member, instead of the hook 54, toward the notched portion 53b of the mechanical key 53.

A manufacturing process for the card key 1 will be explained. The molded body 11 can be manufactured by the well-known injection molding process, wherein the thermosetting resin is injected into a two-divided molding die.

In case of the conventional card key 200, as shown in FIG. 7, it is necessary to form a battery accommodating space 204 and a key accommodating space (not shown) in an inside of the card key 200. Therefore, as shown in FIG. 8, it is necessary to arrange slide cores 213, which correspond to the respective battery and key accommodating spaces, in the molding die 210. In FIG. 8, only one slide core 213 is shown.

According to the above first embodiment, however, it is not necessary to form the battery accommodating space (S1) and the key accommodating space (S2) in the inside of the molded body 11 (for example, as shown in FIG. 4). Therefore, it is not necessary to use the slide core for the molding die. As a result, it is possible to reduce a cost for the molding die and to reduce a manufacturing time for the molded body 11.

The upper housing 21 as well as the lower housing 31 can be manufactured by the injection molding process using a two-divided molding die, wherein thermoplastic resin is injected into the molding die. It is possible to manufacture the upper housing 21 and the lower housing 31, each of which has a three-dimensional shape with a curved surface. In addition, the surface finishing process (such as, coating painting, printing, or the like) is carried out to the upper and lower housings 21 and 31 in a subsequent process.

After the molded body 11, the upper housing 21 and the lower housing 31 are manufactured as above, the molded body 11 is arranged between the upper and the lower housings 21 and 31 (as shown in FIG. 1b and FIG. 2) and the upper and the lower housings 21 and 31 are firmly fixed to each other.

Figure 5:
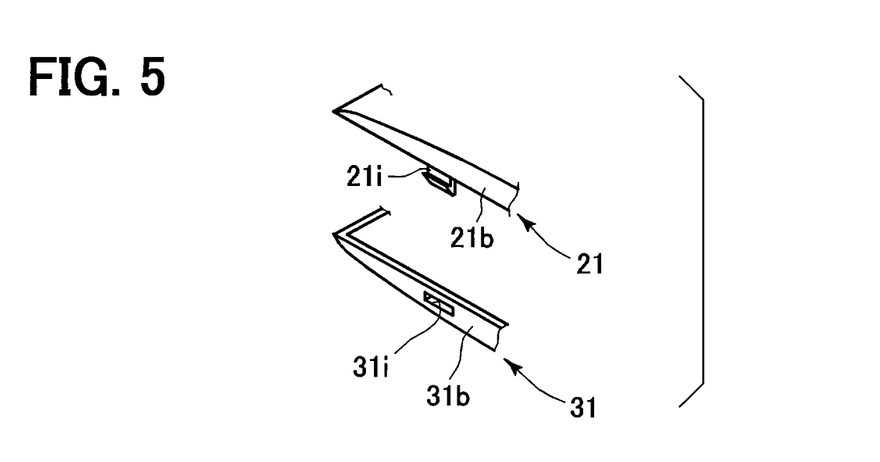
FIG. 5 is a schematic perspective view showing an example of a fixing structure between an upper housing and a lower housing.

For example, the upper and the lower housings 21 and 31 are fixed to each other by adhesive material. Alternatively, as shown in FIG. 5, a hooked portion 21i is formed at the side wall 21b of the upper housing 21, an insertion hole 31i is formed in the side wall 31b of the lower housing 31, and the hooked portion 21i is inserted into the insertion hole 31i. Further alternatively, a projection and a groove are respectively formed in the upper and the lower housings 21 and 31, so that the upper and the lower housings 21 and 31 are fixed to each other by a sliding movement of the upper housing 21 with respect to the lower housing 31.

As understood from the foregoing explanation, each end of the side walls 21b to 21d is brought into close contact with each end of the side walls 31b to 31d, so that the upper and the lower housings 21 and 31 are firmly fixed to each other in a condition that the molded body 11 is interposed between the upper and the lower housings 21 and 31. The external appearance of the card key 1 is decided by the upper and the lower housings 21 and 31. In the conventional card key, the surface finishing process is limited to the front-side surface by constrains in view of the manufacturing process. According to the present embodiment, however, the surface finishing process can be done for almost all portions of the upper and the lower housings 21 and 31. As a result, great individuality (such as, good feeling, aesthetic appearance or the like), which can not be realized by the conventional card key, can be realized in the present embodiment.

In the conventional card key, the marking member (22) has also a function for covering the test points (45). When the corporate mark is changed, a shape and a size of the marking member (22) is also changed in most cases. Then, it becomes necessary to correspondingly change a position of the test points (45). As a result, it may be necessary in some of the cases to change the circuit board and furthermore the molding dies for manufacturing the card key.

According to the present embodiment, however, the marking member 22 is attached to the recessed portion 21e, which is formed at such a position not corresponding to the test points 45. In other words, when the card key 1 is used for a vehicle of a different car manufacturer or used for a different car model, it is sufficient to change the marking member 22 or the marking member together with the upper housing 21. Therefore, it is possible to standardize the position of the test points 45 in the molded body 11. In other words, the molded body 11, for which a major part of the manufacturing cost is necessary, can be commonly used for various kinds of the card keys of different car models.

Accordingly, it is possible to reduce the cost for the molding die for manufacturing the molded body 11. In addition, since the molded body 11 is accommodated in the inside of the upper and the lower housings 21 and 31, it is not necessary to improve quality of the external appearance. Furthermore, it becomes unnecessary to carry out a polishing process for the rear-side surface of the molded body 11. As a result, the cost for the molded body 11 itself can be reduced.

In the present first embodiment, the notched portion 11c is formed in the molded body 11 for accommodating the mechanical key 53, the opening portions 21h and 31h are formed in the upper and the lower housings 21 and 31 so that the mechanical key 53 can be inserted into the card key 1 or can be taken out from the card key 1 through the opening portions 21h and 31h, and the hook 54 is arranged in the card key 1 so that the mechanical key 53 is held in the card key 1 when the projection 54a of the hook 54 is engaged with the notched portion 53b of the mechanical key 53.

According to such a structure, it is sufficient to form the notched portion 11c in the molded body 11 for accommodating the mechanical key 53 in the card key 1. In other words, it is not necessary to form the space in the molded body 11 extending in the lateral direction (in the direction perpendicular to the thickness direction of the molded body). It is, therefore, not necessary to provide the slide core in the molding die so as to form the space for the mechanical key 53. The cost for manufacturing the molding die can be also reduced in this respect.

(Modification)

In the above embodiment, the upper and lower housings 21 and 31 are manufactured by the injection molding process by using the two-divided molding die, wherein the thermoplastic resin is injected into the inside of the molding die. However, an upper and a lower housing 21A and 31A may be manufactured by a press work (a forming process) by use of a sheet-shaped thermoplastic resin 12A, as shown in FIGS. 6A to 6D.

Figure 6A:
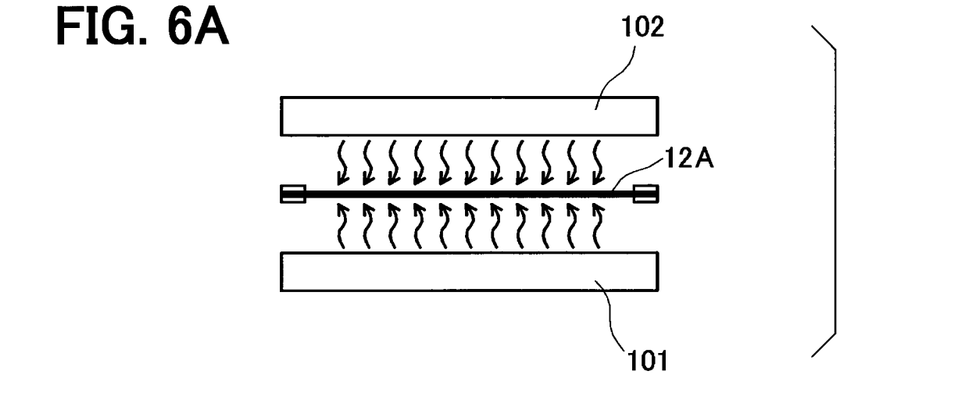
FIGS. 6A, 6B, 6C and 6D are schematic views showing a process for manufacturing an upper housing (and a lower housing) by a press work according to a modification of the present disclosure.
Figure 6B:
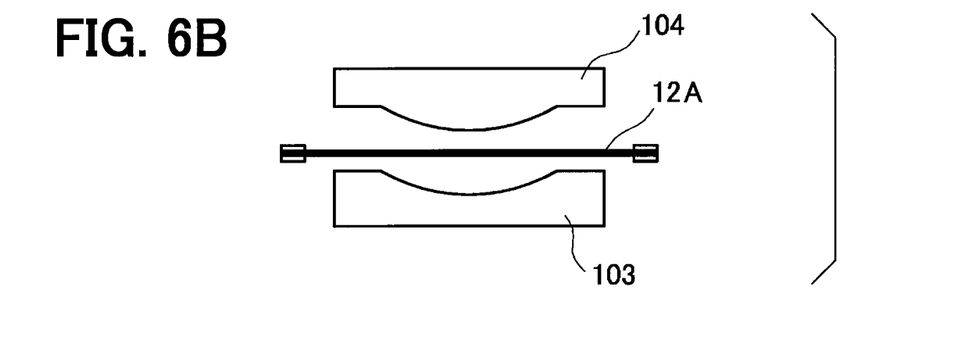
Figure 6C:
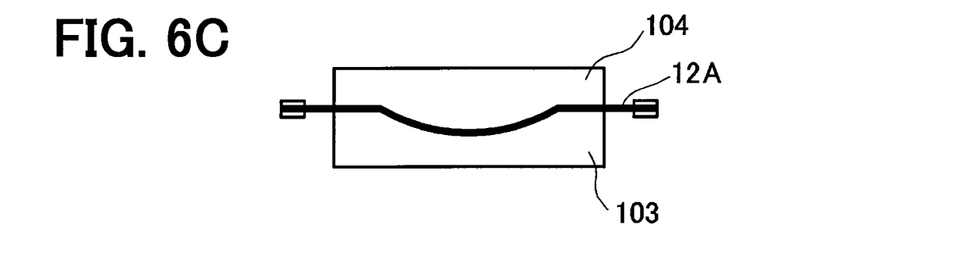
Figure 6D:
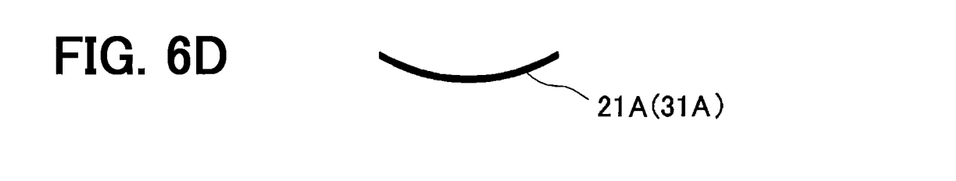

More exactly, the sheet-shaped thermoplastic resin 12A is heated by heating devices 101 and 102, which are opposing to each other, as shown in FIG. 6A, so that the thermoplastic resin is turned soft. Then, the thermoplastic resin 12A (which has turned soft) is pressed by press dies 103 and 104 to form it in a desired shape, as shown in FIGS. 6B and 6C. Finally, a trimming process is applied to the pressed resin 12A to form the upper and the lower housings 21A and 31A, as shown in FIG. 6D.

When transparent resin material is used for the sheet-shaped thermoplastic resin 12A and a printing process is applied to the inner-side surface of the upper housing 21A (and/or the lower housing 31A), the upper housing 21A (and/or the lower housing 31A) having the external appearance of a high class and a deep color effect can be obtained.

In the above first embodiment, the molded body 11 is made of the thermosetting resin. However, the molded body 11 may be made of thermoplastic resin.

What is claimed is:

1. A card key comprising: a molded body formed in a plate shape and having a circuit board, to which electronic parts for communicating with an in-vehicle equipment are mounted and which is covered with and integrally molded with resin; and an upper housing and a lower housing fixed to each other for accommodating the molded body in a space formed between them, wherein an external appearance of the card key is defined by the upper and the lower housings; and the molded body has a notched portion formed at a first side edge to form a space for accommodating a mechanical key, at least one of the upper and the lower housings has an opening portion, through which the mechanical key is inserted into the card key of from which the mechanical key is taken out, and a hook is arranged in an inside of the upper and/or lower housings so as to hold the mechanical key in the card key when the hook is engaged with a notched portion of the mechanical key; and a pair of battery terminals extend in parallel and bridge a cutout formed at a second side edge of the circuit board opposed to the first side edge; wherein a rib is formed on each surface of the upper housing and lower housing, both ribs brought into contact with opposite side surfaces of the molded body located between the first and second side edges.

2. The card key according to claim 1, wherein each of the upper and the lower housings has a three-dimensional outer surface.

3. The card key according to claim 1, wherein the molded body is made of thermosetting resin, while the upper and the lower housings are made of thermoplastic resin.

4. The card key according to claim 3, wherein each of the upper and the lower housings is made of plate-shaped thermoplastic resin and formed by a press work process.

* * * * *